United States Patent
Wang et al.

(10) Patent No.: US 10,270,429 B1
(45) Date of Patent: Apr. 23, 2019

(54) INTERNAL CLOCK DISTORTION CALIBRATION USING DC COMPONENT OFFSET OF CLOCK SIGNAL

(71) Applicant: Micron Technology, Inc., Boise, ID (US)

(72) Inventors: Guan Wang, San Jose, CA (US); Qiang Tang, Cupertino, CA (US); Ali Feiz Zarrin Ghalam, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/848,796

(22) Filed: Dec. 20, 2017

(51) Int. Cl.
| G06F 1/10 | (2006.01) |
| H03K 3/017 | (2006.01) |
| H04L 25/06 | (2006.01) |
| G11C 7/22 | (2006.01) |
| H03K 5/156 | (2006.01) |

(52) U.S. Cl.
CPC .......... H03K 3/017 (2013.01); G06F 1/10 (2013.01); G11C 7/222 (2013.01); H03K 5/1565 (2013.01); H04L 25/063 (2013.01)

(58) Field of Classification Search
CPC ........... G06F 1/10; G11C 7/222; H03K 3/017; H03K 5/1565; H03K 7/08; H04L 25/063
USPC ....................................................... 327/175
See application file for complete search history.

(56) References Cited

U.S. PATENT DOCUMENTS

| 6,356,218 | B1 * | 3/2002 | Brown ................ H03M 1/1019 341/120 |
| 7,423,467 | B1 | 9/2008 | Simon |
| 7,525,358 | B1 * | 4/2009 | Taft ....................... H03K 5/1565 327/175 |
| 9,030,244 | B1 | 5/2015 | Luo et al. |
| 9,219,470 | B1 * | 12/2015 | Venditti ............... H03K 5/1565 |
| 2005/0122149 | A1 * | 6/2005 | Cho ........................ H03K 5/135 327/175 |
| 2005/0184780 | A1 * | 8/2005 | Chun .................... H03K 5/1565 327/175 |

(Continued)

FOREIGN PATENT DOCUMENTS

KR    100843002 B1    7/2008

OTHER PUBLICATIONS

International Application No. PCT/US2018/060647—International Search Report and Written Opinion, dated Mar. 11, 2019, 12 pages.

*Primary Examiner* — William Hernandez
(74) *Attorney, Agent, or Firm* — Perkins Coie LLP

(57) ABSTRACT

Several embodiments of electrical circuit devices and systems with clock distortion calibration circuitry are disclosed herein. In one embodiment, an electrical circuit device includes an electrical circuit die having clock distortion calibration circuitry to calibrate a clock signal. The clock distortion calibration circuitry is configured to compare a first duty cycle of a first voltage signal of the clock signal to a second duty cycle of a second voltage signal of the clock signal. Based on the comparison, the clock calibration circuitry is configured to adjust a trim value associated with at least one of the first and the second duty cycles of the first and the second voltage signals, respectively, to calibrate at least one of the first and the second duty cycles and account for duty cycle distortion encountered as the clock signal propagates through a clock tree of the electrical circuit device.

27 Claims, 7 Drawing Sheets

(56) References Cited

U.S. PATENT DOCUMENTS

| | | |
|---|---|---|
| 2007/0159224 A1 | 7/2007 | Dwarka et al. |
| 2013/0285726 A1* | 10/2013 | Roytman ............... H03K 5/26 |
| | | 327/175 |
| 2015/0171834 A1 | 6/2015 | Arp et al. |
| 2015/0171836 A1 | 6/2015 | Lee |
| 2018/0175834 A1* | 6/2018 | Modi .................... G11C 7/222 |

* cited by examiner

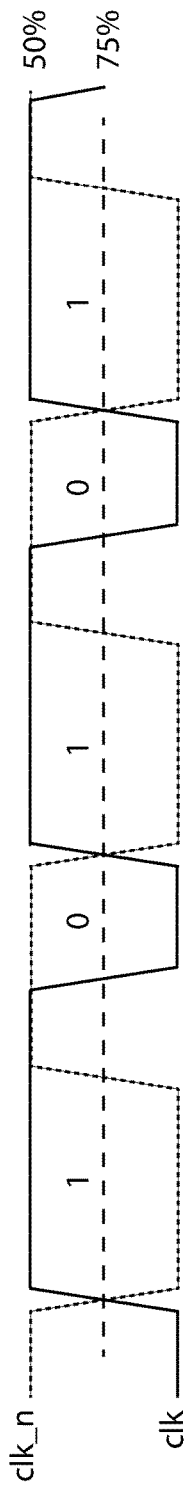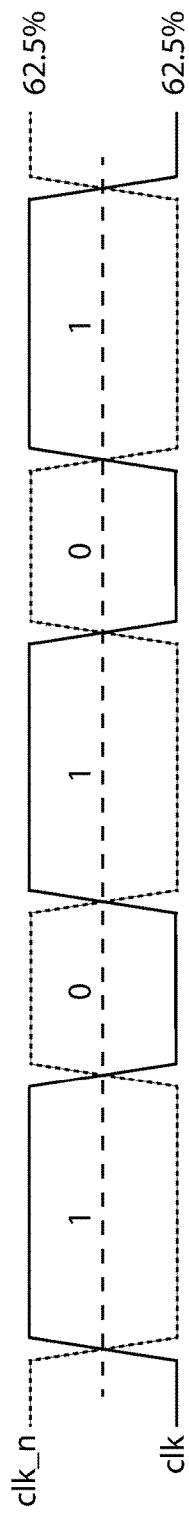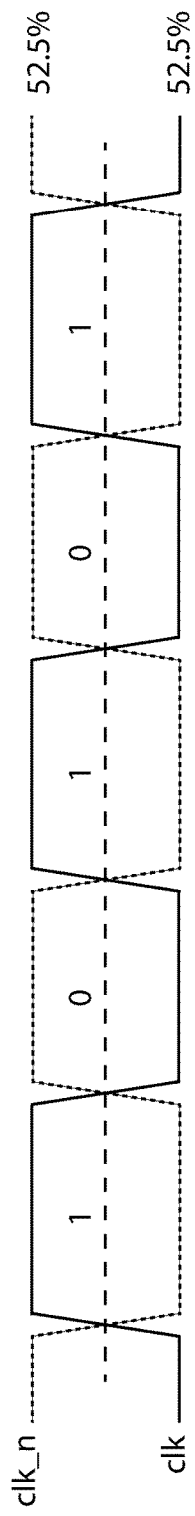

Overall system

US 10,270,429 B1

INTERNAL CLOCK DISTORTION CALIBRATION USING DC COMPONENT OFFSET OF CLOCK SIGNAL

TECHNICAL FIELD

The disclosed embodiments relate to electrical circuit devices and systems, and, in particular, to electrical circuit devices having clock distortion calibration circuitry.

BACKGROUND

Clock signals are used to coordinate actions of electrical circuits in electrical circuit devices. In some devices, these signals can be single-ended clock signals where a signal is transmitted by a voltage and is referenced to a fixed potential (e.g., a ground node). In such devices, one conductor carries the clock signal while another conductor carries the reference potential. Other electrical circuit devices can use a differential clock signal that employs two complementary (e.g., inverse) voltage signals to transmit one information signal. A receiver in such devices extracts information by detecting the potential difference between the complementary voltage signals. Each complementary voltage signal is carried by its own conductor, which means that differential-signaling often requires more wires than single-ended signaling and, thus, more space. Despite this disadvantage, differential signaling has many benefits over single-ended signaling. For example, because the two voltage signals have equal amplitude and opposite polarity relative to a common-mode voltage, return currents and electromagnetic interference generated by each signal are balanced and cancel each other out, which is an advantage especially noticeable at high frequencies. This, in turn, also reduces crosstalk to other nearby signals. In addition, electromagnetic interference or crosstalk introduced by outside sources is often added to each voltage signal, so the magnitude of the interference or crosstalk is reduced when a receiver takes a potential difference between the two signals. Furthermore, differential signaling provides a more straightforward logic state determination procedure, allows for more precise timing, and maintains an adequate signal-to-noise ratio at lower voltages. Even so, neither type of clock signaling is immune to duty cycle distortion.

A duty cycle of a clock signal is a ratio of the pulse time of the clock signal to its cycle period. A duty cycle of a clock signal can become distorted due to a variety of sources, including amplifiers that make up a clock tree, large propagation distances between amplifier stages of the clock tree, and/or parasitic conductor capacitance. Distortion of the duty cycle skews timing margins defined by the clock signal in electrical circuit devices. As a result, an electrical circuit using the distorted clock signal can have smaller timing windows in which to transfer and/or process data, which could lead to reduced pulse widths, data errors, and unreliable circuit performance. As input/output speeds increase (e.g., as the cycles of a clock signal are reduced), it also becomes increasingly more challenging to reduce duty cycle distortion, meaning that the consequences of duty cycle distortion at high input/output speeds are even more apparent. In addition, electrical circuits at different locations (e.g., on different electrical circuit dies) can experience varying degrees of duty cycle distortion of a clock signal due to differing sources of distortion located along the corresponding clock branches of a clock tree that define the clock signal pathways. Thus, it is desirable to mitigate duty cycle distortion of a clock signal at points along the clock signal pathways closest to electrical circuits, especially as input/output speeds increase.

BRIEF DESCRIPTION OF THE DRAWINGS

FIGS. 5A-5C are signal diagrams of complementary voltage signals of a differential clock signal in accordance with embodiments of the present technology.

DETAILED DESCRIPTION

As described in greater detail below, the present technology relates to electrical circuit devices and related systems having clock distortion calibration circuitry. A person skilled in the art, however, will understand that the technology may have additional embodiments and that the technology may be practiced without several of the details of the embodiments described below with reference to FIGS. 1-7. In the illustrated embodiments below, the electrical circuit devices are primarily described in the context of semiconductor devices having one or more semiconductor dies that use a differential clock signal (e.g., NAND storage media). Electrical circuit devices configured in accordance with other embodiments of the present technology, however, can include other types of structures, storage media, and/or clock signals. For example, electrical circuit devices in accordance with other embodiments of the present technology can comprise metamaterials; can include NOR, PCM, RRAM, MRAM, read only memory (ROM), erasable programmable ROM (EROM), electrically erasable programmable ROM (EEROM), ferroelectric, and other storage media, including volatile storage media; and/or can use a single-ended clock signal.

One embodiment of the present technology is an electrical circuit device (e.g., a semiconductor device) that comprises clock distortion calibration circuitry and that utilizes a clock signal (e.g., a differential clock signal). The clock distortion calibration circuitry is configured to compare a duty cycle of a first voltage signal of the clock signal to the duty cycle of a second voltage signal of the clock signal. Based on this comparison, the clock distortion calibration circuitry is further configured to adjust a trim value associated with at least one of the first and the second duty cycles of the first and the second voltage signals, respectively. Using the adjusted trim value, the clock distortion calibration circuitry can calibrate the first and the second duty cycles of the first and the second voltage signals, respectively, of the clock signal. In this manner, the clock distortion calibration circuitry can account for duty cycle distortion of the clock signal accumulated as it propagates through a clock tree of the electrical circuit device.

Figure 1:
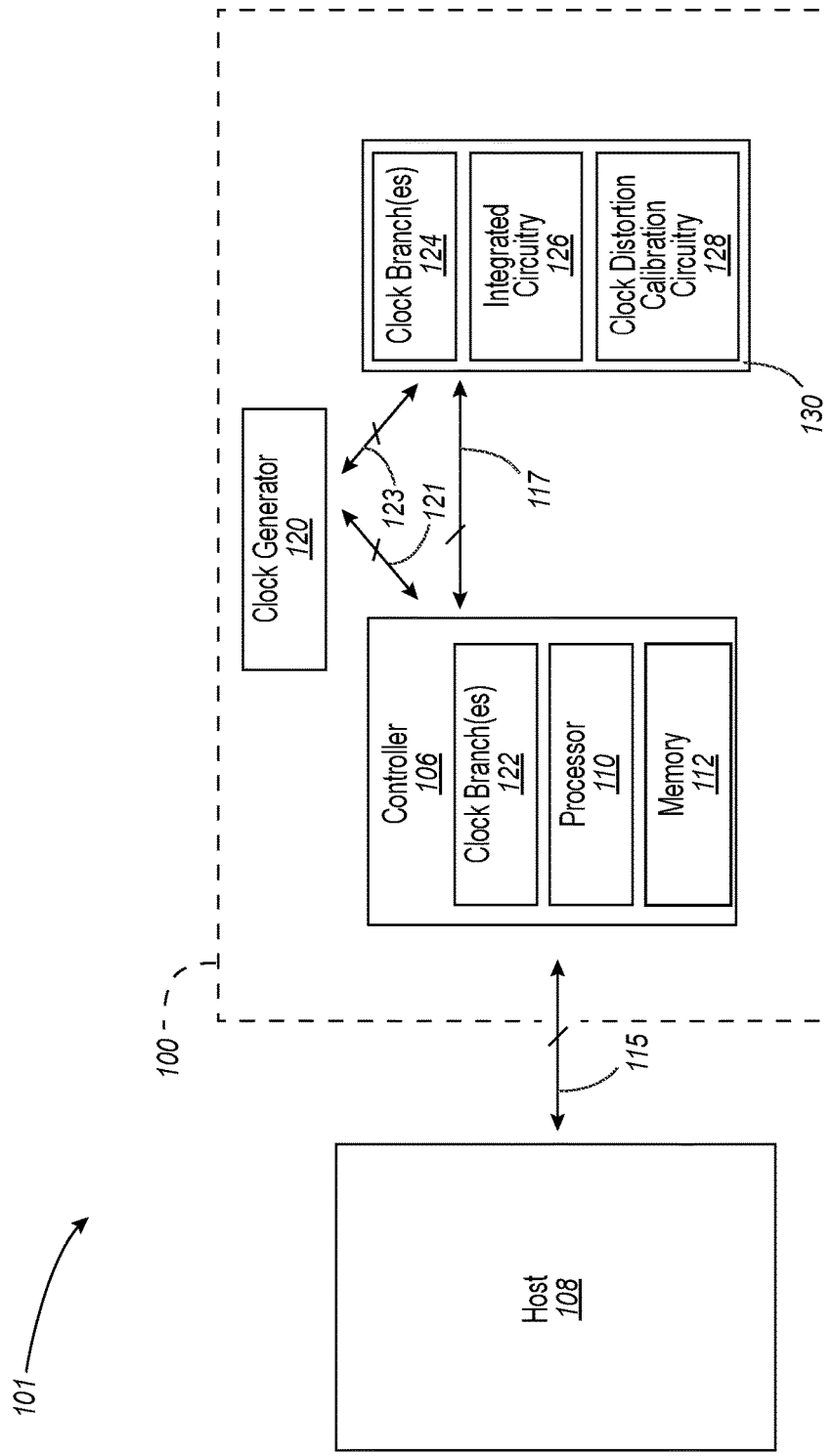
FIG. 1 is a block diagram of a system having an electrical circuit device configured in accordance with an embodiment of the present technology.

FIG. 1 is a block diagram of a system 101 having an electrical circuit device 100 (e.g., a semiconductor device and/or package) configured in accordance with an embodiment of the present technology. As shown, the electrical circuit device 100 includes a clock generator 120, an electrical circuit die 130 (e.g., a semiconductor die), and a controller 106 operably coupling the electrical circuit die 130 to a host device 108 (e.g., an upstream central processor (CPU)). Although illustrated separately from the controller 106 and the clock generator 120 in FIG. 1, the electrical circuit die 130 can comprise the controller 106 and/or the clock generator 120 in some embodiments. Furthermore, in other embodiments, the electrical circuit device 100 can include a plurality of electrical circuit dies 130, which can be vertically stacked (e.g., vertically connected with through-silicon vias (TSVs)) and arranged in a single device package. In still other embodiments, the electrical circuit device 100 can include a plurality of dies 130 distributed across multiple device packages and/or spread out along a single carrier substrate.

The clock generator 120 produces a clock signal (not shown) that is used to coordinate actions of electrical circuits within the electrical circuit device 100. The clock generator 120 transmits the clock signal to various components of the electrical circuit device 100 via a clock tree (partially shown). For example, in the embodiment illustrated in FIG. 1, the clock generator 120 sends the clock signal to the controller 106 via a first clock branch 121 of the clock tree. Similarly, the clock generator 120 sends the clock signal to the electrical circuit die 130 via a second clock branch 123 of the clock tree. As shown, the controller 106 and the electrical circuit die 130 include further clock branches of the clock tree (e.g., clock branch(es) 122 and clock branch(es) 124, respectively), which, in turn, distribute the clock signal to other electrical circuits located on the controller 106 and/or on the electrical circuit dies 130, respectively. In some embodiments, the clock generator 120 can be located on the electrical circuit die 130. In other embodiments including a plurality of electrical circuit dies 130, the clock generator 120 can be located on a dedicated electrical circuit die of the plurality of dies 130 or can be distributed across multiple electrical circuit dies of the plurality of dies 130. In still other embodiments, an electrical circuit device 100 may not include a clock generator 120 or may include only a portion of the clock generator 120. For example, the electrical circuit device 100 may instead rely upon an externally supplied clock signal (e.g., provided by an external host, or by a processor or controller separate from the electrical circuit device). In other embodiments, the clock signal can be partially generated and/or partially supplied externally and partially generated and/or partially supplied by circuitry located on the electrical circuit device 100.

The controller 106 can be a microcontroller, special purpose logic circuitry (e.g., a field programmable gate array (FPGA), an application specific integrated circuit (ASIC), etc.), or other suitable processor. The controller 106 can include a processor 110 configured to execute instructions stored in memory. In the illustrated example, the controller 106 also includes an embedded memory 112 configured to store various processes, logic flows, and routines for controlling operation of the electrical circuit device 100, including managing the electrical circuit die 130 and handling communications between the electrical circuit die 130 and the host device 108. In some embodiments, the embedded memory 112 can include memory registers storing, e.g., memory pointers, fetched data, etc. The embedded memory 112 can also include read-only memory (ROM) for storing micro-code. While the exemplary electrical circuit device 100 illustrated in FIG. 1 includes a controller 106, in another embodiment of the present technology, an electrical circuit device may not include the controller 106, and may instead rely upon external control (e.g., provided by an external host, or by a processor or controller separate from the electrical circuit device). In still other embodiments with a plurality of electrical circuit dies 130, the controller 106 can be integrated onto an individual electrical circuit die of the plurality of dies 130 or can be distributed across multiple electrical circuit dies of the plurality of dies 130.

The controller 106 communicates with the host device 108 over a host-device interface 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

In operation, the controller 106 can communicate with (e.g., read, write, erase, or otherwise communicate (e.g., transfer to or request from)) one or more integrated circuits 126 located on the electrical circuit die 130 over a communication line 117 (e.g., a data bus) in accordance with a clock signal generated by the clock signal generator 120. For example, the controller 106 can read from and/or write to groups of memory pages (not shown) and/or memory blocks (not shown) of a memory region (not shown) on the electrical circuit die 130.

The one or more integrated circuits 126 on the electrical circuit die 130 can be configured to operate as memory regions (e.g., NAND memory regions), logic gates, timers, counters, latches, shift registers, microcontrollers, microprocessors, field programmable gate arrays (FPGAs), sensors, and/or other integrated circuitry. The electrical circuit die 130 can also include other circuit components, such as multiplexers, decoders, buffers, read/write drivers, address registers, data out/data in registers, etc., for accessing and/or processing data and other functionality, such as programming memory cells of a memory region and/or communicating with the controller 106 (e.g., over communication line 117).

As discussed above, a clock signal (e.g., a single-ended or differential clock signal) is generated by the clock generator 120 and sent to various components of the electrical circuit device 100 to coordinate actions of electrical circuits (e.g., the controller 106 and/or the one or more integrated circuits 126 on the electrical circuit die 130) and/or components of the electrical circuits within the electrical circuit device 100. In accordance with the clock signal, the electrical circuits within the electrical circuit device 100 can be configured to process and/or transfer data either once per full cycle (i.e., on the rising edge or the falling edge) of the clock signal or twice per full cycle (i.e., as in double data rate (DDR) clock structures—once on the rising edge and once on the falling edge) of the clock signal.

As discussed in greater detail below, the clock signal can become distorted as it propagates through the clock tree of the electrical circuit device 100. Common sources for this distortion include amplifiers that make up the clock tree, large propagation distances between amplifier stages of the clock tree, and/or parasitic conductor capacitance of the branches of the clock tree. Distortion can be introduced by sources located within an electrical circuit die (e.g., the electrical circuit die 130) and/or by sources located external to the electrical circuit die. Thus, external and internal distortion can accumulate within an electrical circuit die such that each electrical circuit die can exhibit varying degrees of duty cycle distortion of the clock signal. As noted above, duty cycle distortion skews timing margins defined by the clock signal in electrical circuit devices. As a result, distortion of the duty cycle of a clock signal often results in electrical circuits of the electrical circuit device having smaller timing windows in which to process and/or transfer data, which could lead to reduced pulse widths, data errors, and unreliable circuit performance, especially as input/output speeds increase and the cycle of the clock signal is reduced. For example, in double data rate (DDR) clock structures where data is processed and/or transferred on both the rising edge and the falling edge of a clock signal, a 50% duty cycle is desired to allow equal timing margins for each transfer and/or process activation. However, distortion skews these timing margins, meaning that the electrical circuit device 100 has a smaller timing window in which to transfer and/or process data on one side of the clock signal cycle. Thus, it is desirable to mitigate duty cycle distortion within a clock signal, especially as input/output speeds increase.

Methods of reducing duty cycle distortion include using a delay locked loop (DLL) circuit and/or using a general, static trim value for all dies within a semiconductor device. However, DLL circuity requires a necessary warm-up cycle; consumes a large amount of power; and is relatively complex, requiring a large amount of area. Furthermore, because each clock branch of the clock tree exhibits duty cycle distortion of a clock signal to varying degrees due to differing sources of distortion along those clock branches, using a common circuit and/or a general, static trim for all of the dies within a semiconductor device does not account for these die-to-die variations.

As described in greater detail below with respect to FIGS. 2-6B, the system 101 can utilize clock distortion calibration circuitry 128 located on the electrical circuit die 130 of the electrical circuit device 100 to calibrate the clock signal on one or more branches of the clock tree to mitigate and/or eliminate duty cycle distortion at one or more points closer to electrical circuits (e.g., integrated circuits 126) on the electrical circuit die 130. For example, the clock distortion calibration circuitry 128 can sample and calibrate the clock signal at points along the clock tree (1) that are internal to the electrical circuit die 130 to accommodate for both external and internal sources of distortion but (2) that are not so far along the clock tree to have split into several clock branches that each lead to different electrical circuits, exhibit various magnitudes of distortion, and require separate calibration. Furthermore, in embodiments that include a plurality of electrical circuit dies 130, the system 101 can utilize clock distortion calibration circuitry 128 on all or a subset of the electrical circuit dies 130 in the plurality of dies 130. In these and other embodiments, internal clock distortion calibration circuitry 128 can be used in addition to or in lieu of other calibration circuitry (e.g., a DLL calibration circuitry and/or a common, external clock distortion calibration circuit 128 for all electrical circuit dies within the electrical circuit device 100) and/or of other techniques (e.g., a general, static trim value for all electrical circuit dies). Moreover, as shown in the embodiments illustrated in FIGS. 2 and 3, the clock distortion calibration circuitry 128 consumes a relatively smaller amount of area and a relatively lesser amount of power than other circuitry (e.g., DLL calibration circuitry) used for calibration. The clock calibration circuitry 128 also does not require a warm-up cycle and is able to begin calibration during the first iteration of the clock signal. In addition, the clock distortion calibration circuitry 128 can utilize stable trim (e.g., digital trim) and biasing (e.g., voltage and/or current) values specific to each individual electrical circuit die 130, accounting for die-to-die variations in exhibited duty cycle distortion of the clock signal.

Figure 2:
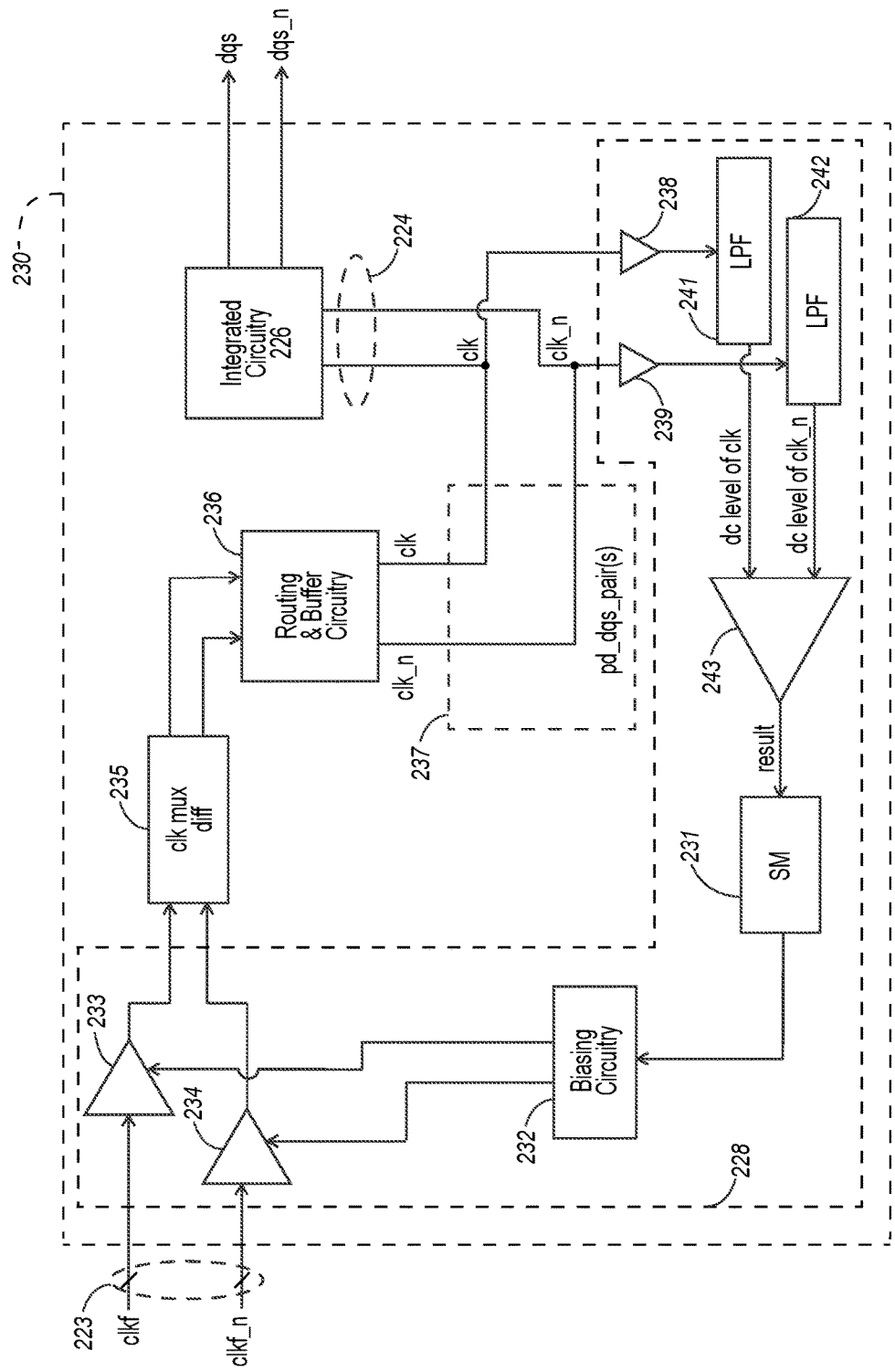
FIG. 2 is a block diagram of an electrical circuit die having clock distortion calibration circuitry in accordance with an embodiment of the present technology.

FIG. 2 is a block diagram of an electrical circuit die 230 (e.g., a semiconductor die) having clock distortion calibration circuitry 228 (e.g., clock distortion calibration circuitry 128 of FIG. 1) in accordance with an embodiment of the present technology. For example, the electrical circuit die 230 can be the electrical circuit die 130 illustrated in FIG. 1. As shown, the electrical circuit die 230 intakes an external differential clock signal via inputs clkf and clkf_n on clock branch 223 (e.g., clock branch 123 of FIG. 1) of a clock tree. As explained above, the clock signal input into the electrical circuit die 230 can already include duty cycle distortion from sources external to the electrical circuit die 230 (e.g., due to board design and/or other sources of the system 101). In other embodiments, the electrical circuit die 230 can include an internal clock generator (e.g., clock generator 120 of FIG. 1) and can use an internally-distributed clock signal produced by the clock generator.

Complementary voltage signals of the clock signal input through inputs clkf and clkf_n of the electrical circuit die 230 are input through a respective input buffer 233 and 234, through a differential multiplexer 235, and through routing and buffer circuitry 236 of the electrical circuit die 230. At this point, complementary voltage signals clk and clk_n form one or more pd_dqs_pairs 237, which are routed to other integrated circuitry 226 (e.g., integrated circuitry 126 of FIG. 1) of the electrical circuit die 230 via clock branch(es) 224 (e.g., clock branch(es) 124 of FIG. 1) of the clock tree. In other words, this point represents a common point along the internal clock pathway of the electrical circuit die 230 that is a furthest distal point from the inputs clkf and clkf_n before the voltage signals clk and clk_n are branched in multiple directions to other integrated circuitry 226. As mentioned above, duty cycle distortion can be added to the clock signal up to this common point from sources along the internal clock pathway and can accumulate with distortion already introduced by sources encountered along the clock pathway located external to the electrical circuit die 230. As illustrated in FIG. 2, it is from this common point that the clock distortion calibration circuity 228 samples the clock signal. In other embodiments, however, the clock distortion calibration circuitry 228 can sample the clock signal at other points along the internal clock pathway of the electrical circuit die 230. For example, the clock distortion calibration circuitry 228 can sample the clock signal before and/or after the clock signal is input into the input buffers 233 and 234 (e.g., to calibrate only externally added duty cycle distortion), input into the differential multiplexer 235, input into the routing and buffer circuitry 236, and/or input into the other integrated circuitry 226 on the electrical circuit die 230 (e.g., at one or more points along the clock branch(es) 224). In these and still other embodiments, the electrical circuit die 230 can include multiple clock distortion calibration circuits 228 and can sample and calibrate the clock signal at all or a subset of the points along the internal clock pathway described above.

According to one embodiment of the present technology, the clock distortion calibration circuitry 228 can include buffers 238 and 239, low pass filters 241 and 242, a comparator 243 (e.g., an auto-zeroing comparator), a state machine 231, and biasing circuitry 232. In other embodiments, the clock distortion calibration circuitry can include any combination of these components and/or can omit some or all of these components.

In accordance with one aspect of the present technology, the clock distortion calibration circuitry 228 samples the complementary voltage signals clk and clk_n of the clock signal to calibrate the duty cycle of each voltage signal clk and clk_n. More specifically, the clock distortion calibration circuitry 228 passes the voltage signals clk and clk_n through respective low pass filters 241 and 242, which converts the voltage signals clk and clk_n to direct current (dc) level (e.g., analog level) representations of the duty cycles of the voltage signals clk and clk_n. The comparator 243 converts the dc level representations into digital signal representations, compares the digital signal representations, and provides one or more results of the comparison to the state machine 231. The state machine 231 performs an algorithm (e.g., a bisectional sweep algorithm and/or a binary search) to calculate and/or adjust (e.g., using a lookup table) one or more trim values (e.g., digital trim values), which are used to decrease the duty cycle of the voltage signal with the larger duty cycle and to increase the duty cycle of the voltage signal with the smaller duty cycle. The trim value(s) are passed to biasing circuitry 232, which converts the trim value(s) into biasing voltage(s) and/or biasing current(s) that are fed into the voltage signal clk and/or clk_n via corresponding input buffers 233 and 234.

Figure 3:
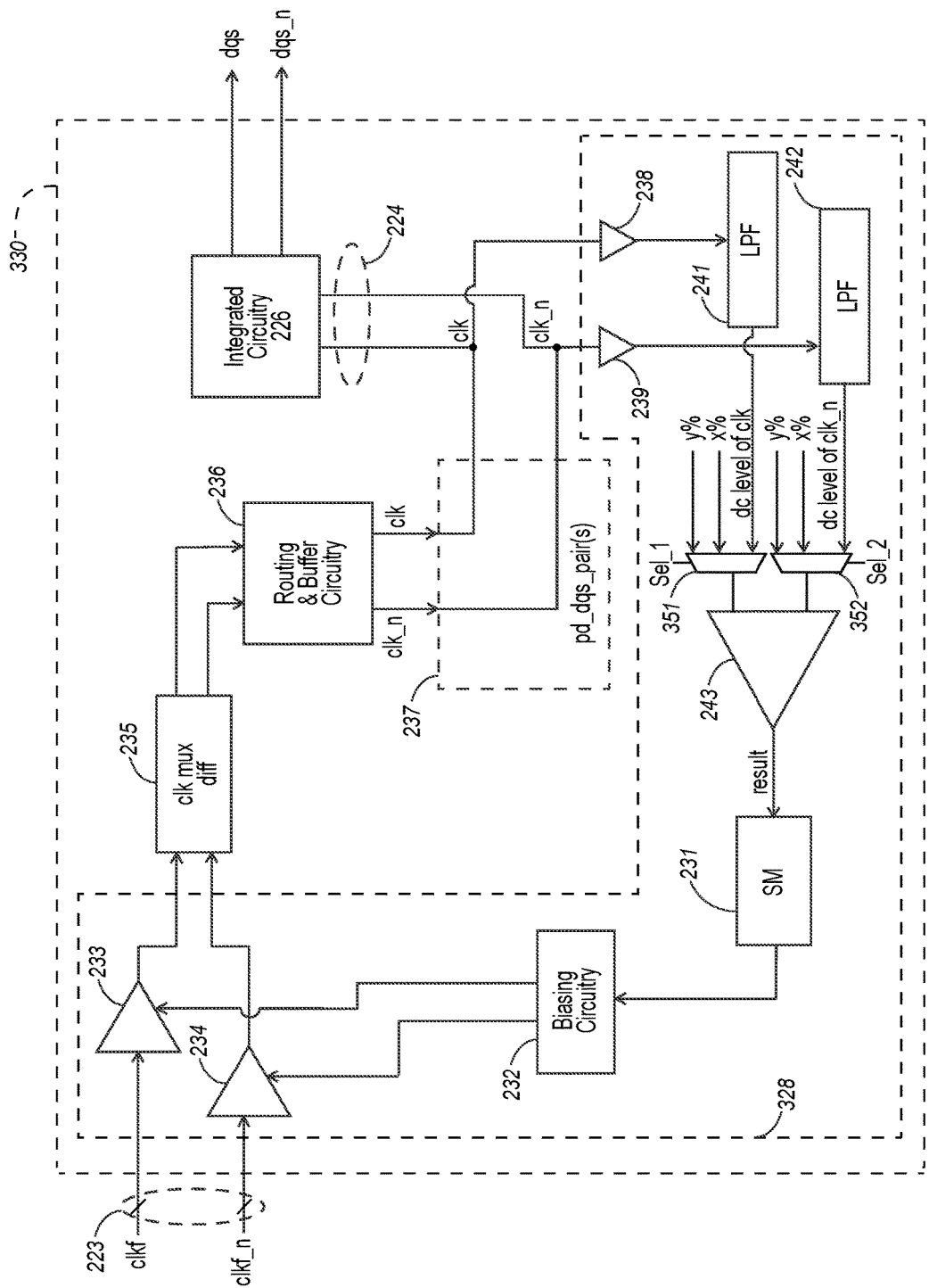
FIG. 3 is a block diagram of an electrical circuit die having clock distortion calibration circuitry in accordance with another embodiment of the present technology.

Referring now to FIG. 3, the illustrated electrical circuit die 330 is similar to the electrical circuit die 230 of FIG. 2 with the exception that clock distortion calibration circuitry 328 of FIG. 3 includes additional multiplexers 351 and 352 with respective voltage divider circuitry (not shown) connected to their inputs % x and % y. As described in greater detail below with respect to FIG. 6B, multiplexers 351 and 352 provide pass/fail check functionality to determine whether the duty cycles of complementary voltage signals clk and clk_n are sufficient. Furthermore, multiplexers 351 and 352 allow the clock distortion calibration circuitry 328 to more finely tune the duty cycles of the complementary voltage signals clk and clk_n of the differential clock signal. In other embodiments, the electrical circuit die 330 can intake and/or use a single-ended clock signal (e.g., a voltage signal on input clkf and/or on input clkf_n and/or a reference signal on input clkf and/or on input clkf_n) and can calibrate the duty cycle of the single-ended clock signal in accordance with the method described below with respect to FIG. 6B.

Figure 4:
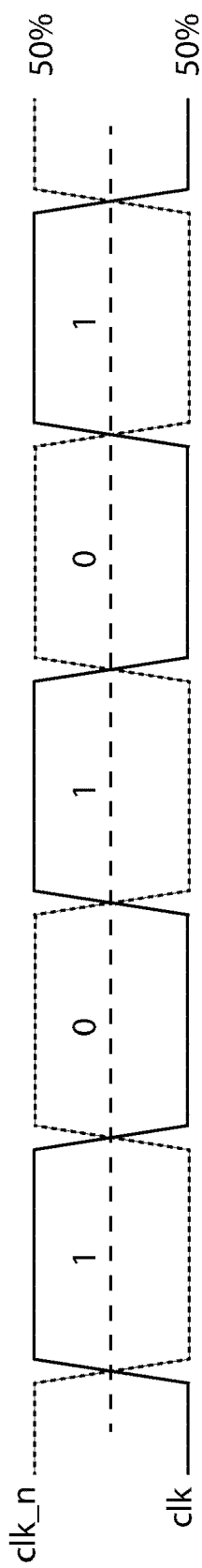
FIG. 4 is a signal diagram of complementary voltage signals of a differential clock signal.

FIGS. 4-5C are signal diagrams of complementary voltage signals of a differential clock signal. Referring to FIG. 4, complementary voltage signals clk and clk_n are illustrated from a clock structure with blender. As shown, each voltage signal clk and clk_n has an ideal 50% duty cycle, meaning the pulse time of the voltage signal clk is equal to exactly half of the cycle of the voltage signal clk. Similarly, the pulse time of the complementary voltage signal clk_n is equal to exactly half of the cycle of the voltage signal clk_n. Because voltage signals clk and clk_n are taken from a clock structure with blender, the rising edge of the voltage signal clk aligns with the falling edge of its complementary voltage signal clk_n. Thus, for timing purposes, an electrical circuit using double data rate transfers would have the same timing margin (e.g., amount of time) to process and/or transfer data when the clock signal is in a first state (e.g., "1") (i.e., when voltage signal clk is high and voltage signal clk_n is low) as the timing margin to process and/or transfer data when the clock signal is in a second state (e.g., "0") (i.e., when voltage signal clk is low and voltage signal clk_n is high).

FIG. 5A is a signal diagram of the complementary voltage signals clk and clk_n. As shown, the duty cycle of the voltage signal clk has been distorted from 50% to 75%. As explained above, common sources for this distortion include amplifiers that make up the clock tree, large propagation distances between amplifier stages of the clock tree, and/or parasitic conductor capacitance of the corresponding clock branches of the clock tree. This distortion can be introduced from sources external to an individual electrical circuit die (e.g., sources encountered before inputs clkf and clkf_n on electrical circuit dies 130, 230, and/or 330; FIGS. 1-3) and/or can be introduced from sources encountered along the internal clock pathway of the individual electrical circuit die (e.g., sources internal to electrical circuit dies 130, 230, and/or 330).

FIGS. 5B and 5C are signal diagrams of the complementary voltage signals clk and clk_n after being calibrated by clock distortion calibration circuitry in accordance with embodiments of the present technology. As can be seen with reference to FIG. 5B, following calibration (e.g., by clock distortion calibration circuitry 128, 228, and/or 328; FIGS. 1-3), the duty cycle of the voltage signal clk has been reduced from 75% to 62.5%, and the duty cycle of the voltage signal clk_n has been increased from 50% to 62.5%. As shown, the up pulse time of the voltage signal clk fully aligns with the down pulse time of the voltage signal clk_n and vice versa. As a result, an electrical circuit using double data rate transfers has increased timing margins (e.g., greater amounts of time) to process and/or transfer data when the clock signal is in the first state and when the clock signal is in the second state. Referring now to FIG. 5C, following calibration (e.g., by clock distortion calibration circuitry 128 and/or 328; FIGS. 1 and/or 3), the duty cycles of the signals clk and/or clk_n can be further reduced from 62.5% to 52.5% (e.g., using multiplexers 351 and/or 352; FIG. 3). As shown, the up pulse time of the voltage signal clk continues to fully align with the down pulse time of the voltage signal clk_n and vice versa. However, the timing margin to process and/or transfer data when the clock signal is in the first state (e.g., "1") has been decreased while the timing margin to process and/or transfer data when the clock signal is in the second state (e.g., "0") has been increased. As a result, the timing margins (e.g., amounts of time) defined by a full cycle of the clock signal are more evenly distributed between the two states of the clock signal such that an electrical circuit using double data rate transfers has a more similar timing margin to process and/or transfer data when the clock signal is in the first state as the timing margin to process and/or transfer data when the clock signal is in the second state.

Figure 6A:
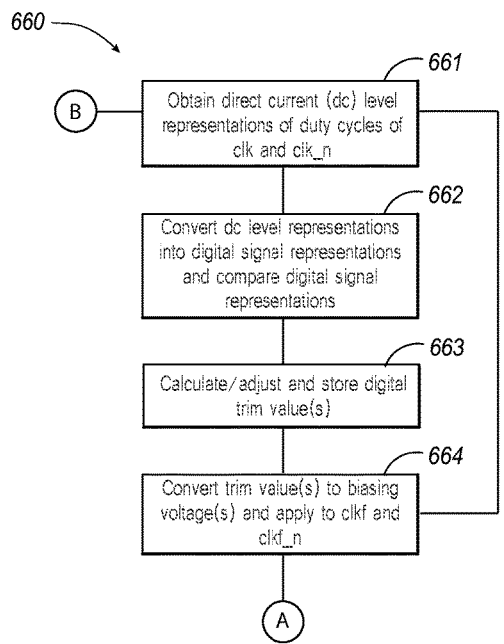
FIGS. 6A and 6B are flow diagrams illustrating methods of operating clock distortion calibration circuitry in accordance with embodiments of the present technology.
Figure 6B:
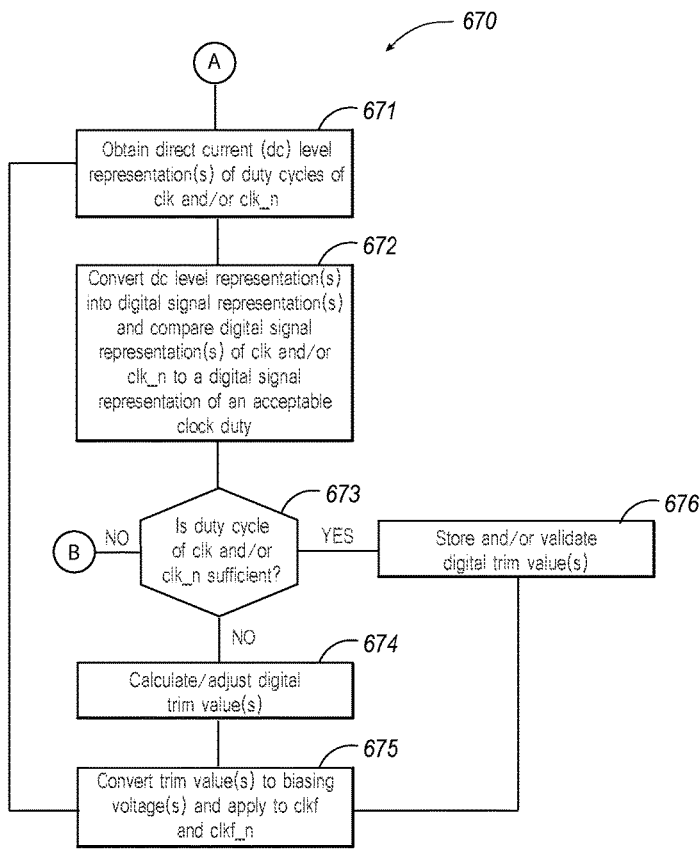

FIG. 6A is a flow diagram illustrating a routine 660 directed to a method of operating clock distortion calibration circuitry (e.g., clock distortion calibration circuitry 128, 228, and/or 328) in accordance with embodiments of the present technology. FIG. 6B is a flow diagram illustrating a routine 670 directed to a method of operating clock distortion calibration circuitry (e.g., clock distortion calibration circuitry 128 and/or 338) in accordance with some embodiments of the present technology. The routines 660 and 670 can be executed, for example, automatically by various components of the clock distortion calibration circuitry upon receiving a clock signal (e.g., at an electrical circuit die) from a clock generator (e.g., clock generator 120; FIG. 1).

In other embodiments, the routines 660 and 670 can be executed, for example, by various components of clock distortion calibration circuitry at the direction of an electrical circuit device controller (e.g., controller 106 of electrical circuit device 100; FIG. 1), at the direction of an electrical circuit die controller (e.g., a controller located on electrical circuit dies 130, 230, and/or 330), and/or at the direction of a host device (e.g., the host device 108; FIG. 1).

Referring to FIG. 6A (and to FIGS. 5A and 5B for purposes of illustration), the routine 660 obtains direct current (dc) level (e.g., analog level) representations of the duty cycles of the voltages signals clk and clk_n of a clock signal (block 661). For example, the routine 660 can pass the complementary voltage signals clk and clk_n of FIG. 5A through buffers 238 and 239 (FIGS. 2 and 3), respectively, and through low pass filters 241 and 242 (FIGS. 2 and 3), respectively, to obtain dc level representations of the duty cycles of the voltage signals clk and clk_n.

At block 662, the routine 660 can (1) convert the dc level representations of the duty cycles of the voltage signals clk and clk_n into digital signal representations of the duty cycles of the voltage signals clk and clk_n and (2) compare the digital signal representations to determine which duty cycle is larger and which duty cycle is smaller. For example, the routine 660 can pass the dc level representations of the duty cycles to a comparator (e.g., comparator 243; FIGS. 2 and 3) that is able to handle very small voltage offsets (e.g., an auto-zeroing comparator) to convert the dc level representations into digital signal representations and to compare the digital signal representations to one another. In embodiments that include clock distortion calibration circuitry with one or more multiplexers (e.g., clock distortion calibration circuitry 128 and/or 328; FIGS. 1 and/or 3), the routine 660 can selectively feed (e.g., using select inputs, for example, select inputs Sel_1 and Sel_2 of multiplexers 351 and 352, respectively; FIG. 3) the dc level representations into the comparator to be converted to digital signal representations. The comparator can then pass a comparison result of the digital signal representations to a state machine (e.g., state machine 231; FIGS. 2 and 3) indicating which duty cycle of the voltage signals clk and clk_n is larger and which is smaller. In the illustrated example of FIG. 5A, the result sent to the state machine from the comparator would indicate that the duty cycle of the voltage signal clk is larger than the duty cycle of the voltage signal clk_n. In some embodiments, the result can include a digital signal representation of the magnitude of the difference between the duty cycles. For example, if 1.0V is equivalent to an entire cycle of the voltage signal, the result of the comparison of the voltage signals clk and clk_n in FIG. 5A can include an indication that the duty cycles differ by 0.25V (i.e., (1.0V*75%)–(1.0V*50%) or 0.75V–0.50V). In other embodiments, the result can indicate the average (e.g., mean, median, mode, etc.) of the two duty cycles. For example, if 1.0V is equivalent to an entire cycle of the voltage signal, the result of the comparison of the voltage signals clk and clk_n in FIG. 5A can include an indication that the average (e.g., mean) of the duty cycles is 0.625V (i.e., 62.5% or ((1.0V*75%)+(1.0V*50%))/2)). In still other embodiments, the result can simply include an indication of which digital signal of a duty cycle of a voltage signal is larger relative to the digital signal of the duty cycle of the other voltage signal.

At block 663, the routine 660 can calculate and/or adjust one or more digital trim values of the electrical circuit die and store the digital trim value(s). In some embodiments, the digital trim value(s) can commonly correspond to the voltage signals clk and clk_n. In other embodiments, some or all of the digital trim value(s) can correspond to only the voltage signal clk or only the voltage signal clk_n. For example, the state machine (e.g., state machine 243; FIGS. 2 and 3) of the clock distortion calibration circuitry can perform a bisectional sweep algorithm and/or a binary search (e.g., over multiple iterations) to calculate and/or adjust the digital trim value(s) and store the digital trim value(s) (e.g., on the state machine, a controller of the electrical circuit device, a controller of the electrical circuit die, and/or a host device). In embodiments where the state machine stores the digital trim value(s) at a location other than at the state machine, the digital trim value(s) can be provided to the state machine (e.g., when the clock distortion calibration circuitry is activated). In these and other embodiments, the digital trim value(s) can be passed to the state machine to validate the passed digital trim value(s) and/or to validate digital trim value(s) stored on the state machine.

The newly calculated and/or adjusted digital trim value(s) can be used to make the duty cycle of the voltage signal with the larger duty cycle smaller and/or to make the duty cycle of the voltage signal with the smaller duty cycle larger. In embodiments where the result from the comparator includes an indication of the magnitude of the difference between the duty cycles, the state machine can calculate and/or adjust the trim value(s) (e.g., using a lookup table, a bisectional sweep algorithm, and/or a binary search) to make the larger duty cycle smaller by one half of the magnitude of the difference and to make the smaller duty cycle larger by one half of the magnitude of the difference. For example, the state machine can, using the example illustrated in FIGS. 5A and 5B, adjust the trim value(s) to make the duty cycle of the voltage signal clk smaller by 12.5% and make the duty cycle of the voltage signal clk_n larger by 12.5%. In contrast, in embodiments where the result from the comparator includes an indication of the average (e.g., mean, median, mode, etc.) of the duty cycles, the state machine can calculate and/or adjust the trim value(s) (e.g., using a lookup table, a bisectional sweep algorithm, and/or a binary search) to set both duty cycles equivalent to the average of the duty cycles. For example, the state machine can, using the example illustrated in FIGS. 5A and 5B, adjust the trim value(s) to make the duty cycles of the voltage signals clk and clk_n both equivalent to the mean of the duty cycles (e.g., 62.5%). In other embodiments where the result sent to the state machine includes only an indication of which duty cycle of a voltage signal is larger relative to the duty cycle of the other voltage signal, the state machine can calculate and/or adjust the trim value(s) to make the larger duty cycle smaller and the smaller duty cycle larger by one or more predetermined values (e.g., one or more preset percentages). For example, the state machine can, using the example illustrated in FIGS. 5A and 5B, calculate and/or adjust the digital trim value(s) to decrease the duty cycle of the voltage signal clk down by 12.5% (i.e., a preset percentage) and the duty cycle of the voltage signal clk_n up by 12.5% (i.e., the same or a different preset percentage). In these and other embodiments, the trim value(s) can also be calculated and/or adjusted according to results of previous iterations of the clock distortion calibration circuitry. For example, the clock distortion calibration circuitry in a first iteration calibrating the voltage signals clk and clk_n of FIG. 5A can adjust the duty cycles by 12.5%. On the next iteration, the clock distortion calibration circuitry can note (e.g., from the result sent to the state machine from the comparator) that the difference between the duty cycles of the voltage signals clk and clk_n in the second iteration is smaller or larger in comparison to the difference in the first iteration and can, accordingly, calculate and/or adjust the digital trim value(s) to adjust the duty cycles of the voltage signals clk and/or clk_n by a lesser, greater, and/or equivalent amount (e.g., a percentage lesser, greater, and/or equivalent to 12.5%) than the adjustment made in the first iteration.

At block 664, the routine 660 can convert the digital trim value(s) into one or more biasing voltages and/or biasing currents that can be used to calibrate the duty cycles of the voltage signals of the clock signal to account for duty cycle distortion. For example, the state machine can pass the digital trim value(s) to biasing circuitry (e.g., biasing circuitry 232; FIGS. 2 and 3), which can convert the digital trim value(s) into one or more biasing voltages and/or biasing currents. The biasing circuitry can feed the one or more biasing voltages and/or biasing currents into corresponding input buffers (e.g., input buffers 233 and 234; FIGS. 2 and 3) at the beginning of the internal clock pathway of the electrical circuit die (e.g., directly after the inputs clkf and clkf_n on clock branch 223 or shortly thereafter; FIGS. 2 and 3). In some embodiments, the routine 660 can automatically return to block 661 to perform the next iteration of clock distortion calibration. In other embodiments, the routine 660 can wait to return to block 661 until directed to return (e.g., by the controller 106 of the electrical circuit device 100; a controller internal to the electrical circuit die 130, 230, and/or 330; and/or the host device 108). In this manner, the routine 660 is able to calibrate (e.g., over a single and/or multiple iterations) the duty cycles of the complementary voltage signals of a differential clock signal by calculating one or more optimized digital trim values to account for distortion introduced by external and/or internal distortion sources.

Referring now to FIG. 6B, the routine 670 can check whether the duty cycle of the voltage signal clk and/or the duty cycle of the voltage signal clk_n are sufficient. In some embodiments, the routine 670 can be executed before the routine 660 is executed. In these and other embodiments, the routine 670 can be executed after a single iteration of the routine 660 and/or after all or a subset of iterations of the routine 660. In still other embodiments, the routine 670 can be executed simultaneously with the routine 660 (e.g., in embodiments that include multiple clock distortion calibration circuits and/or multiple components of the clock distortion calibration circuitry).

At block 671, the routine 670 obtains direct current (dc) level (e.g., analog level) representation(s) of the duty cycle(s) of the voltage signal(s) clk and/or clk_n similar to block 661 of the routine 660 discussed above. At block 672, the routine 670 (1) converts one or more voltage representations of acceptable duty cycles into digital signal representation(s) of the acceptable duty cycle(s), (2) converts one or both of the dc level representations of the duty cycle(s) of the voltage signal(s) clk and/or clk_n into digital signal representation(s), and (3) compares the digital signal representation(s) of acceptable duty cycle(s) to the digital signal representation(s) of the duty cycle(s) of the voltage signal(s) clk and/or clk_n similar to block 662 of the routine 660. For example, an electrical circuit die (e.g., electrical circuit die 130 and/or 330; FIGS. 1 and 3) can include voltage divider circuits configured to pass one or more voltage representations of acceptable duty cycle(s) (e.g., one or more threshold levels) to the inputs (e.g., inputs % x and % y; FIG. 3) of multiplexers (e.g., multiplexers 351 and 352; FIG. 3) of the clock distortion calibration circuitry. Although multiplexers 351 and 352 are illustrated in FIG. 3 as having the same inputs % x and % y, the voltage values (e.g., threshold levels) delivered to these inputs can vary and/or can be adjusted using the voltage divider circuits. For example, in some embodiments, the voltage values delivered to inputs % x and % y of multiplexer 351 can be the same and/or can vary. In these and other embodiments, the voltage values delivered to inputs % x and % y of multiplexer 351 can be the same as and/or can vary from the voltage values delivered to inputs % x and % y of multiplexer 352. In these and still further embodiments, the voltage values delivered to inputs % x and % y of multiplexer 351 and/or of multiplexer 352 in a first iteration can be the same as and/or can vary from the voltage values delivered to the same respective inputs in a second iteration (e.g., by adjusting and/or programming the voltage divider circuits).

The multiplexers can be connected to a comparator (e.g., comparator 243; FIG. 3) and can be configured to selectively feed into the comparator (1) voltage representation(s) attached to input(s) % x and/or % y and/or (2) dc level representation(s) of the duty cycle(s) of the voltage signal(s) clk and/or clk_n. In some embodiments, one multiplexer (e.g., multiplexer 351; FIG. 3) selectively feeds (e.g., using a select input of the one multiplexer, for example, select input Sel_1; FIG. 3) a direct current level (e.g., analog level) representation of a duty cycle of a voltage signal (e.g., the voltage signal clk; FIG. 3) into a comparator (e.g., comparator 243; FIG. 3) while the other multiplexer (e.g., multiplexer 352; FIG. 3) selectively feeds (e.g., using a select input of the other multiplexer, for example, select input Sel_2; FIG. 3) a direct current level (e.g., analog level) representation of an acceptable duty cycle(s) (e.g., a threshold level) from an input of the other multiplexer (e.g., inputs % x and/or % y of the multiplexer 352) into the comparator. The comparator 243 can convert the dc level representation(s) and/or the voltage representation(s) of acceptable duty cycle(s) (e.g., the threshold level(s)) into digital signal representations and can compare the digital signal representations in a manner similar to block 662 of the routine 660 discussed above. In other embodiments, clock distortion calibration circuitry can include more than two multiplexers, and the routine 670 can be configured to serially compare digital signal representation(s) of the duty cycle(s) of the voltage signal(s) clk and/or clk_n to digital signal representation(s) of acceptable duty cycle(s) (e.g., threshold level(s)) in the same iteration of the routine 670. In these and still other embodiments, the routine 670 can compare digital signal representation(s) of the duty cycle(s) of the voltage signal(s) clk and/or clk_n to any combination of the one or more digital representations of acceptable duty cycle(s) (e.g., threshold level(s)) connected to the input % x and/or % y of the multiplexers.

At block 673, the routine 670 can determine whether the duty cycle of the voltage signal clk and/or clk_n is sufficient. For example, if (1) the routine 670 (e.g., using comparator 243) compares the digital signal representation of the duty cycle of the voltage signal clk to a digital signal representation of a maximum acceptable duty cycle (e.g., programmed into and provided by a voltage divider circuit) and (2) the routine 670 (e.g., using the state machine 231) notes from the result of the comparison that the digital signal representation of the voltage signal clk is smaller than or equal to the digital signal representation of the maximum acceptable duty cycle (e.g., of the maximum threshold level), the routine 670 (e.g., using the state machine) can determine that the duty cycle of the voltage signal clk is sufficient and can store one or more final digital trim values (e.g., at the state machine 231, at an electrical circuit die, at the controller 106, and/or at the host device 108) and/or can otherwise validate already calculated and/or stored digital trim value(s) (block 676).

Alternatively, if (1) the routine 670 compares the digital signal representation of the duty cycle of the voltage signal clk to the digital signal representation of the maximum acceptable duty cycle (e.g., of the maximum threshold level) and (2) the routine 670 notes from the result of the comparison that the digital signal representation of the voltage signal clk is larger than or equal to the digital signal representation of the maximum acceptable duty cycle, the routine 670 (e.g., using the state machine) can determine that the duty cycle of the voltage signal is not sufficient and can initiate the routine 660 at block 661. In these and other embodiments, the routine 670 can calculate and/or adjust one or more digital trim values (e.g., a digital trim value common to both of the voltage signals clk and clk_n and/or a digital trim value corresponding only to the voltage signal clk). For example, the routine 670 can adjust the digital trim value(s) corresponding to the duty cycle(s) of the voltage signal clk and/or clk_n to adjust the duty cycle(s) of the voltage signal(s) clk and/or clk_n by a predetermined value (e.g., a preset percentage). At block 675, the routine 670 can convert the digital trim value(s) to one or more biasing voltages and/or biasing currents (e.g., using biasing circuitry 232) and can feed the one or more biasing voltages and/or biasing currents back into the internal clock pathway similar to block 664 of the routine 660. The routine 670 can automatically return to block 671 to check whether the duty cycle(s) of the voltage signal(s) clk and clk_n are sufficient and/or can automatically proceed to block 676 to store and/or validate the digital trim value(s). In other embodiments, the routine 670 can wait to return to block 671 and/or can wait to proceed to block 676 until directed to return and/or proceed (e.g., by the controller 106 of the electrical circuit device 100; a controller internal to the electrical circuit die 130, 230, and/or 330; and/or the host device 108).

Although the routine 670 is discussed in the context of comparing digital signal representation(s) of the duty cycle(s) of the voltage signal(s) clk and clk_n to a digital signal representation of a maximum acceptable duty cycle (e.g., of a maximum threshold level) for purposes of illustration, the routine 670 can also operate in the context of comparing digital signal representation(s) of the duty cycle(s) of the voltage signal(s) clk and clk_n to a digital signal representation of a minimum acceptable duty cycle (e.g., of a minimum threshold level) and/or to a digital signal representation of any voltage value (e.g., any threshold level) the voltage divider circuits can deliver to the inputs of multiplexers 351 and/or 352. Furthermore, although the routines 660 and 670 of FIGS. 6A and 6B are discussed above in the context of obtaining direct current (dc) level (e.g., analog level) representation(s) of duty cycle(s) of a clock signal and converting the dc level representation(s) into digital signal representation(s), the present technology is not so limited. For example, clock distortion calibration circuitry in accordance with an embodiment of the present technology can obtain digital signal representation(s) of the duty cycle(s) of the clock signal without taking dc level (e.g., analog level) representation(s) of the duty cycle(s). In other embodiments, the clock distortion calibration circuitry can take dc level (e.g., analog level) representation(s) of the duty cycle(s) of the clock signal and compare the dc level representation(s) to one another and/or to voltage value representation(s) of acceptable duty cycle(s) (e.g., threshold levels) without obtaining digital signal representations of the duty cycle(s) of the clock signal and/or of the acceptable duty cycle(s). In still other embodiments, the clock distortion calibration circuitry can obtain digital signal representation(s) of the duty cycle(s) of the clock signal, convert the digital signal representation(s) of the duty cycle(s) into dc level (e.g., analog level) representation(s) of the duty cycle(s) of the clock signal, and compare the dc level representation(s) to one another and/or to dc level (e.g., analog level) representation(s) of acceptable duty cycle(s) (e.g., threshold levels).

FIGS. 5B and 5C illustrate an example of a result of passing the voltage signals clk and clk_n of FIG. 5B through clock distortion calibration circuitry (e.g., clock distortion calibration circuitry 128 and/or 328; FIGS. 1 and/or 3) using the routine 670. As discussed above, FIG. 5B illustrates the duty cycles of the voltage signals clk and clk_n after being run through one or more iterations of the routine 660. The routine 670 can obtain direct current (dc) level (e.g., analog level) representation(s) of the duty cycle(s) of the voltage signal(s) clk and/or clk_n of FIG. 5B (e.g., using the low pass filter(s) 241 and/or 242). In this example, voltage divider circuit(s) connected to inputs % x and % y of multiplexers 351 and 352 deliver, in a first iteration, dc level representations of a maximum acceptable duty cycle (e.g., a maximum threshold level of 60%) to input % y of multiplexer 351 and input % y of multiplexer 352 and a minimum acceptable duty cycle (e.g., a minimum threshold level of 40%) to input % x of multiplexer 351 and input % x of multiplexer 352. For the sake of example, the routine 670 can pass (e.g., using the select inputs Sel_1 and Sel_2 of multiplexers 351 and 352; FIG. 3) the dc level representation of the duty cycle of the voltage signal clk and the dc level representation of the maximum acceptable duty cycle (e.g., of the maximum threshold level of 60%) to the comparator (e.g., by using select input Sel_1 of the multiplexer 351 and select input Sel_2 of multiplexer 352) in the first iteration. The routine 670 can convert the passed dc level representations into digital signal representations and can compare the digital signal representations (e.g., using the comparator 243) to produce a comparison result. In the illustrated example, the result would show that the duty cycle of the voltage signal clk (i.e., 62.5%) is larger than the maximum acceptable duty cycle (e.g., the maximum threshold level of 60%). The routine 670 can determine the duty cycle of the voltage signal clk is not sufficient and can initiate the routine 660 at block 661 to continue calibrating the duty cycles of the voltage signals clk and clk_n. Additionally or alternatively, the routine 670 can calculate and/or adjust one or more digital trim values associated with the voltage signal clk to decrease the duty cycle of the voltage signal, for example, by a predetermined value (e.g., a preset percentage equivalent to the difference between the maximum and/or minimum acceptable duty cycle (e.g., threshold level) and a 50% duty cycle). In the illustrated embodiment, the routine 670 can calculate and/or adjust one or more digital trim values associated with the voltage signal clk to decrease the duty cycle of the voltage signal clk by 10% (i.e., the percentage differential between the threshold level (60%) and a 50% duty cycle). The routine 670 can then proceed to store the new digital trim value(s) (e.g., at the state machine 231) and/or can return to block 671 for the next iteration of routine 670.

In a second iteration of the routine 670, the routine 670 can compare a digital signal representation of the duty cycle of the voltage signal clk_n of FIG. 5B to the digital signal representation of the maximum acceptable duty cycle (e.g., the maximum threshold level of 60%) and accordingly calculate and/or adjust one or more digital trim values associated with the voltage signal clk_n to calibrate the duty cycle of the voltage signal clk_n in a manner similar to the calibration of the duty cycle of the voltage signal clk discussed above. In this way, the routine 670 can calibrate the duty cycles of the voltage signals clk and/or clk_n of FIG. 5B to account for duty cycle distortion and arrive at the duty cycles of the voltage signals clk and clk_n in FIG. 5C. In other embodiments with more than two multiplexers, the duty cycle of the voltage signal clk_n can be calibrated in a similar manner during the first iteration of the routine 670 (e.g., serially to or simultaneously with the calibration of the duty cycle of the voltage signal clk).

In future iterations of the routine 670, the digital signal representations of the duty cycles of the voltage signals clk and clk_n can be compared to digital signal representations of a minimum acceptable duty cycle (e.g., a minimum threshold level) and/or to other acceptable duty cycles (e.g., other threshold levels) by programming and/or adjusting the voltage divider circuits connected to the inputs % x and/or % y of the multiplexers 351 and/or 352 to deliver direct current representations of the minimum acceptable duty cycle and/or the other acceptable duty cycles. For example, in future iterations of the routine 670 on the voltage signals clk and clk_n illustrated in FIG. 5C, a digital signal representation of the duty cycle of the voltage signal clk_n can be compared to a digital signal representation of a different maximum acceptable duty cycle (e.g., a different threshold level of 51%) delivered to input % x and/or to input % y of multiplexer 351. The routine 670 can accordingly (1) calculate and/or adjust one or more digital trim values associated with the voltage signal clk_n to decrease duty cycle of the voltage signal clk_n by a different predetermined value (e.g., by a different present percentage of 0.5%, 1%, 2.5%, etc.), (2) store the new digital trim value(s), and/or (3) initiate the routine 660 at block 661 to further calibrate the voltage signals clk and clk_n. In this manner, the embodiment illustrated in FIG. 3 and the routine 670 illustrated in FIG. 6B provide pass/fail check functionality to the routine 660 illustrated in FIG. 6A and/or allow the clock distortion calibration circuitry (e.g., clock distortion calibration circuitry 128 and/or 328; FIGS. 1 and 3) to more finely tune the duty cycles of the complementary voltage signals clk and clk_n of the clock signal (e.g., when the duty cycles of the complementary voltage signals match and/or when the duty cycles of the voltage signals clk and clk_n oscillate about the 50% duty cycle mark in multiple iterations of the routine 660).

Figure 7:
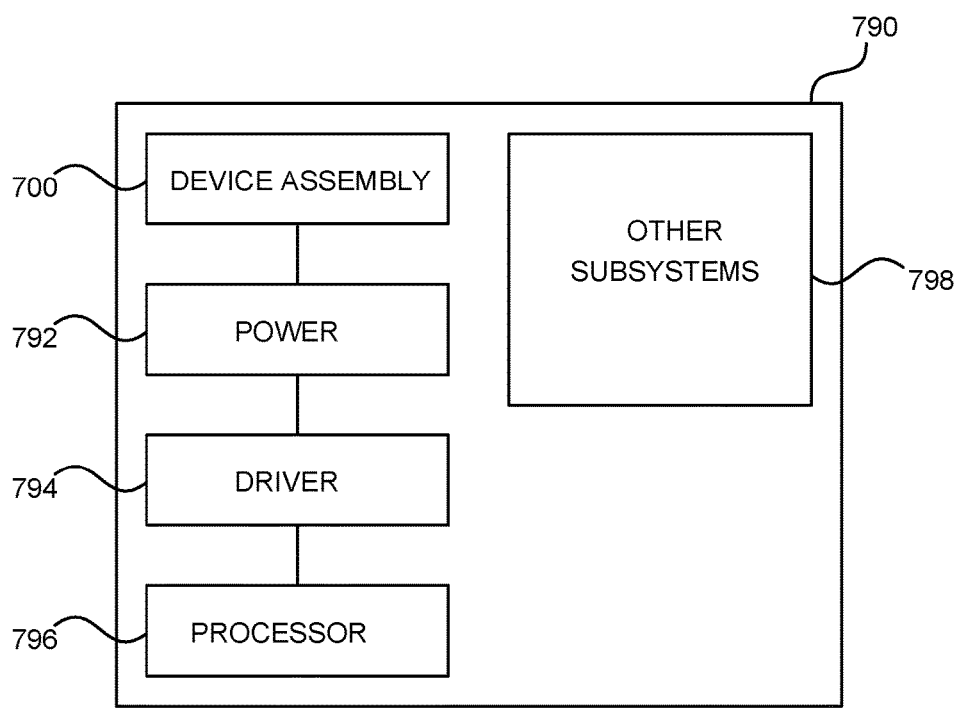
FIG. 7 is a schematic view of a system that includes an electrical circuit device in accordance with embodiments of the present technology.

FIG. 7 is a schematic view of a system that includes an electrical circuit device in accordance with embodiments of the present technology. Any one of the foregoing electrical circuit devices described above with reference to FIGS. 1-6B can be incorporated into any of a myriad of larger and/or more complex systems, a representative example of which is system 790 shown schematically in FIG. 7. The system 790 can include an electrical circuit device assembly 700, a power source 792, a driver 794, a processor 796, and/or other subsystems and components 798. The electrical circuit device assembly 700 can include features generally similar to those of the electrical circuit device described above with reference to FIGS. 1-6B, and can, therefore, include various features of clock distortion calibration. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers, vehicles, appliances, and other products. Components of the system 790 may be housed in a single unit or distributed over multiple, interconnected units (e.g., through a communications network). The components of the system 790 can also include remote devices and any of a wide variety of computer readable media.

From the foregoing, it will be appreciated that specific embodiments of the invention have been described herein for purposes of illustration, but that various modifications may be made without deviating from the disclosure. For example, an electrical circuit device (e.g., electrical circuit device 100; FIG. 1) can include one or more external clock distortion calibration circuits (e.g., clock distortion calibration circuits 128, 228, and/or 328; FIGS. 1-3) to calibrate the clock signal before and/or after it is input into individual electrical circuit dies and/or into the controller 106. In these and other embodiments, the electrical circuit device can include one or more clock distortion calibration circuits for a single-ended clock signal. For example, clock distortion calibration circuitry can intake a signal-ended clock signal (e.g., using a single input buffer) and compare digital signal representations of the duty cycle of the clock signal to digital signal representations of acceptable duty cycles via a single multiplexer in a manner similar to the routine 670 discussed above. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A semiconductor device comprising clock distortion calibration circuitry configured to:
    compare a first duty cycle of a first voltage signal of a clock signal to a second duty cycle of a second voltage signal of the clock signal that is complementary to the first voltage signal,
    based on the comparison, adjust a trim value associated with the first and the second duty cycles of the first and the second voltage signals to adjust the first duty cycle and the second duty cycle to the average of the first duty cycle and the second duty cycle, and
    calibrate at least one of the first and the second duty cycles of the first and the second voltage signals using the adjusted trim value.

2. The semiconductor device of claim 1, wherein the clock distortion calibration circuitry is further configured to:
    obtain, using a first low pass filter, a first direct current (dc) level representation of the first duty cycle;
    obtain, using a second low pass filter, a second dc level representation of the second duty cycle; and
    convert, using a comparator, the first and the second dc level representations into a first digital signal representation and a second digital signal representation, respectively.

3. The semiconductor device of claim 2, wherein the clock distortion calibration circuitry is configured to compare the first duty cycle to the second duty cycle by comparing, using the comparator, the first digital signal representation to the second digital signal representation.

4. The semiconductor device of claim 1, wherein the clock distortion calibration circuitry is configured to adjust the trim value using a state machine.

5. The semiconductor device of claim 1, wherein the clock distortion calibration circuitry is further configured to (1) convert the trim value into one or more biasing voltages and/or biasing currents and (2) calibrate at least one of the first and the second duty cycles by applying the one or more biasing voltages and/or biasing currents to at least one of a corresponding first input buffer and a corresponding second input buffer of the first voltage signal and the second voltage signal, respectively.

6. The semiconductor device of claim 5, wherein the clock distortion calibration circuitry is configured to convert the trim value into the one or more biasing voltages and/or biasing currents using biasing circuitry.

7. The semiconductor device of claim 1, wherein the trim value is a first trim value associated with the first duty cycle of the first voltage signal, and wherein the clock distortion calibration circuitry is further configured to track the first trim value and a second trim value associated with the second duty cycle of the second voltage signal.

8. The semiconductor device of claim 7, wherein the clock distortion calibration circuitry is further configured to:
compare the first duty cycle to a threshold; and
adjust the first trim value based on the comparison of the first duty cycle to the threshold.

9. The semiconductor device of claim 8, wherein the clock distortion calibration circuitry is configured to adjust the first trim value to adjust the first duty cycle by an amount dependent on the threshold.

10. The semiconductor device of claim 1, wherein the clock distortion calibration circuitry is further configured to compare the first duty cycle to a threshold.

11. The semiconductor device of claim 10, wherein the clock distortion calibration circuitry is further configured to adjust the trim value based on the comparison of the first duty cycle to the threshold.

12. The semiconductor device of claim 1, wherein the clock distortion calibration circuitry is configured to adjust the trim value to (1) decrease the first duty cycle of the first voltage signal by one half of a difference between the first duty cycle and the second duty cycle of the second voltage signal and (2) increase the second duty cycle of the second voltage signal by one half of the difference.

13. The semiconductor device of claim 1, further comprising a clock generator configured to produce the clock signal.

14. A method of operating clock distortion calibration circuitry to calibrate a first duty cycle of a first voltage signal of a clock signal and a second duty cycle of a second voltage signal of the clock signal, the method comprising:
measuring the first duty cycle;
measuring the second duty cycle;
comparing the first duty cycle to the second duty cycle;
based on the comparison, adjusting a trim value associated with at least one of the first voltage signal and the second voltage signal to adjust the first trim value and/or the second trim value to the average of the first duty cycle and the second duty cycle;
converting the trim value into one or more biasing voltages and/or biasing currents; and
calibrating at least one of the first duty cycle and the second duty cycle by applying the one or more biasing voltages and/or biasing currents to at least one of a corresponding first input buffer and a corresponding second input buffer of the first voltage signal and the second voltage signal, respectively.

15. The method of claim 14, wherein measuring the first duty cycle comprises obtaining a first direct current (dc) level representation of the first duty cycle, and wherein measuring the second duty cycle comprises obtaining a second dc level representation of the second duty cycle.

16. The method of claim 15 further comprising converting the first dc level representation into a first digital signal representation of the first duty cycle and converting the second dc level representation into a second digital signal representation of the second duty cycle.

17. The method of claim 14, wherein
measuring the first duty cycle comprises obtaining a first direct current (dc) level representation of the first duty cycle, and
the method further comprises:
converting the first dc level representation into a first digital signal representation of the first duty cycle;
producing a dc level representation of an acceptable duty cycle;
converting the dc level representation of the acceptable duty cycle into a second digital signal representation of the acceptable duty cycle;
comparing the first digital signal representation to the second digital signal representation; and
based on the comparison of the first digital signal representation to the second digital signal representation, determining whether the first duty cycle is sufficient.

18. The method of claim 17, wherein the one or more biasing voltages and/or biasing currents are a first set of biasing voltages and/or biasing currents, and wherein the method further comprises:
based on a determination that the first duty cycle is not sufficient, adjusting the trim value;
converting the trim value into a second set of biasing voltages and/or biasing currents; and
calibrating the first duty cycle by a predetermined value by applying at least one biasing voltage and/or biasing current in the second set of biasing voltages and/or biasing currents to the corresponding first input buffer of the first voltage signal.

19. The method of claim 18, wherein the trim value is a first trim value associated with the first duty cycle of the first voltage signal, and wherein the method further comprises tracking the first trim value and a second trim value associated with the second duty cycle of the second voltage signal.

20. A system, comprising:
a host device; and
a plurality of semiconductor dies operably connected to the host device, wherein one or more semiconductor dies of the plurality of semiconductor dies includes clock distortion calibration circuitry configured to—
compare a first duty cycle of a first voltage signal of a clock signal to a second duty cycle of a second voltage signal of the clock signal that is complementary to the first voltage signal,
based on the comparison, adjust a trim value associated with at least one of the first and the second duty cycles of the first and the second voltage signals to adjust the first duty cycle and/or the second duty cycle to the average of the first duty cycle and the second duty cycle, and
calibrate at least one of the first and the second duty cycles of the first and the second voltage signals, respectively, using the adjusted trim value.

21. The system of claim 20, wherein the clock distortion calibration circuitry is further configured to:

obtain, using a first low pass filter, a first direct current (dc) level representation of the first duty cycle;

obtain, using a second low pass filter, a second dc level representation of the second duty cycle; and convert, using a comparator, the first and the second dc level representations into a first digital signal representation and a second digital signal representation, respectively.

22. The system of claim 21, wherein the clock distortion calibration circuitry is configured to compare the first duty cycle to the second duty cycle by comparing, using the comparator, the first digital signal representation to the second digital signal representation.

23. The system of claim 20, wherein the clock distortion calibration circuitry is further configured to (1) convert the trim value into one or more biasing voltages and/or biasing currents and (2) calibrate at least one of the first and the second duty cycles by applying the one or more biasing voltages and/or biasing currents to at least one of a corresponding first input buffer and a corresponding second input buffer of the first voltage signal and the second voltage signal, respectively.

24. The system of claim 23, wherein the clock distortion calibration circuitry is configured to convert the trim value into the one or more biasing voltages and/or biasing currents using biasing circuitry.

25. The system of claim 20, wherein the clock distortion calibration circuitry is further configured to compare the first duty cycle to a threshold.

26. The system of claim 25, wherein the clock distortion calibration circuitry is further configured to adjust the trim value based on the comparison of the first duty cycle to the threshold.

27. The system of claim 20, wherein the clock distortion calibration circuitry is further configured to store the trim value on at least one of the host device, on one or more of the plurality of semiconductor dies, and on a state machine of the clock distortion calibration circuitry.

* * * * *